United States Patent
Chang et al.

(10) Patent No.: US 10,819,339 B2
(45) Date of Patent: Oct. 27, 2020

(54) CAPACITIVE TOUCH SENSING CIRCUIT

(71) Applicant: Raydium Semiconductor Corporation, Hsinchu (TW)

(72) Inventors: Chih-Kai Chang, Keelung (TW); Chih-Hsiung Chen, Zhubei (TW); Yu-Chin Hsu, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 16/728,052

(22) Filed: Dec. 27, 2019

(65) Prior Publication Data
US 2020/0220545 A1 Jul. 9, 2020

(30) Foreign Application Priority Data
Jan. 4, 2019 (TW) .............................. 108100394 A

(51) Int. Cl.
*G06F 3/044* (2006.01)
*H03K 17/96* (2006.01)
*G06F 3/041* (2006.01)

(52) U.S. Cl.
CPC ......... *H03K 17/9622* (2013.01); *G06F 3/044* (2013.01); *G06F 3/0418* (2013.01)

(58) Field of Classification Search
CPC ......... G06F 1/1643; G06F 3/041–0428; G06F 3/03547; G06F 2203/04103–04113
See application file for complete search history.

(56) References Cited

U.S. PATENT DOCUMENTS

| 2018/0004349 A1* | 1/2018 | Gicquel | G06F 3/044 |
| 2019/0187832 A1* | 6/2019 | Lee | G06F 3/0412 |
| 2019/0213374 A1* | 7/2019 | Kwon | G06F 3/0412 |

* cited by examiner

*Primary Examiner* — Sanghyuk Park

(57) ABSTRACT

A capacitive touch sensing circuit includes a first switch to a fourteenth switch, an operational amplifier, a comparator, a detection capacitor, a feedback capacitor, an amplifier capacitor and a mutual inductance capacitor. The tenth switch is coupled between a first node and a second node respectively coupled to a negative input terminal and an output terminal of operational amplifier. The amplifier capacitor is coupled between a third node and a fourth node. The eleventh switch is coupled between the first node and the third node. The twelfth switch is coupled between the second node and the fourth node. The thirteenth switch is coupled between the third node and the second node. The fourteenth switch is coupled between the fourth node and the first node. The capacitive touch sensing circuit sequentially operates under a first charging phase, a first transfer phase, a second charging phase and a second transfer phase.

15 Claims, 12 Drawing Sheets

VCM+(VCM-VL)xCb/Cop-Nx(VH-VCM)xCfb/Cop
(<VCM)

CAPACITIVE TOUCH SENSING CIRCUIT

BACKGROUND OF THE INVENTION

1. Field of the Invention

The invention relates to touch sensing; in particular, to a capacitive touch sensing circuit.

2. Description of the Prior Art

In a self-capacitance touch sensing circuit, as shown in FIG. 1, in a charge phase, a sensing capacitor Cb is coupled between an input voltage VIN and a ground terminal GND, and a feedback capacitor Cfb is coupled between a compensation voltage Vc and the ground terminal GND. Therefore, the input voltage VIN charges the sensing capacitor Cb and the compensation voltage Vc charges the feedback capacitor Cfb. A voltage that a negative input terminal − of the operational amplifier 10 receives is 0. A positive input terminal + of the operational amplifier 10 is coupled to a common-mode voltage VCM, and an output voltage Vout outputted by the operational amplifier 10 is equal to the common-mode voltage VCM.

As shown in FIG. 2, in a transfer phase, the sensing capacitor Cb is coupled between the negative input terminal − of the operational amplifier 10 and the ground terminal GND, and the following Equation 1 can be obtained:

$VIN \times Cb = VCM \times Cb + (VCM - Vout) \times Cop$; that is, the output voltage $Vout = VCM - [(VIN - VCM) \times Cb/Cop]$      Equation 1

Next, as shown in FIG. 3, when a single compensation is performed in the transfer phase, the feedback capacitor Cfb is also coupled between the negative input terminal − of the operational amplifier 10 and the ground terminal GND, then the following Equation 2 can be obtained:

$VIN \times Cb + Vc \times Cfb = VCM \times Cb + (VCM - Vout) \times Cop + VCM \times Cfb$; that is, the output voltage $Vout = VCM - [(VIN - VCM) \times Cb/Cop] + [(VCM - Vc) \times Cfb/Cop]$      Equation 2

Since the sensing capacitor Cb will cause a difference between the output voltage Vout and the common-mode voltage VCM in the above-mentioned operations, the comparator output in the capacitance-to-digital converter (CDC) can be used to control another count capacitor to make the output voltage Vout equal to the common-mode voltage VCM before the end of the transfer phase.

It is assumed that after performing K compensations in the transfer phase, the output voltage Vout can be equal to the common mode voltage VCM, where K is a positive integer, then K can be used as a baseline count value:

$VIN \times Cb + N \times Vc \times Cfb = VCM \times Cb + (VCM - Vout) \times Cop + K \times VCM \times Cfb$; that is, the output voltage $Vout = VCM - [(VIN - VCM) \times Cb/Cop] + [K \times (VCM - Vc) \times Cfb/Cop]$      Equation 3

And, the baseline count value $K = (VIN - VCM) \times Cb/(VCM - Vc) \times Cfb$      Equation 4

When the sensing capacitor Cb changes, the charges change during the transfer phase, which causes the output voltage output by the operational amplifier 10 to change from Vout to Vout'. The voltage difference (Vout'−Vout) between Vout and Vout' is a detectable voltage level and the corresponding sensed count value K' can be obtained by using a capacitance digital converter (CDC), and the difference between the sensed count value K' and the baseline count value K is the sensing count variation value:

$Vout' - Vout = VCM - [(VIN - VCM) \times (Cb + \Delta Cb)/Cop] - [VCM - (VIN - VCM) \times (Cb + \Delta Cb)/Cop] = -(VIN - VCM) \times \Delta Cb/Cop$      Equation 5

$K' = [(VIN - VCM) \times (Cb + \Delta Cb)]/[(VCM - Vc) \times Cfb]$      Equation 6

A conventional capacitance-to-digital converter (CDC) for capacitance sensing is shown in FIG. 4. In order to eliminate low-frequency in-phase noise, two phases are used here to discuss the situation of self-capacitance, one is PAD=a low-voltage VL(RX), and the other is PAD=a high-voltage VH(RX).

Substituting the input voltage VIN=the low-voltage VL and the compensation voltage Vc=the high-voltage VH in the above Equations 1-6, the baseline count value in the state of low-voltage VL can be obtained:

$K(VL) = [(VCM - VL) \times Cb/Cop]/[VH - VCM) \times Cfb/Cop] = [(VCM - VL) \times Cb]/[(VH - VCM) \times Cfb]$      Equation 7

Substituting the input voltage VIN=the high-voltage VH and the compensation voltage Vc=the low-voltage VL in the above Equations 1-6, the baseline count value under the state of high-voltage VH can be obtained:

$K(VH) = [(VH - VCM) \times Cb/Cop]/[(VCM - VL) \times Cfb/Cop] = [(VH - VCM) \times Cb]/[(VCM - VL) \times Cfb]$      Equation 8

If the average value of the high-voltage VH and the low-voltage VL is equal to the common-mode voltage VCM; that is, (VH+VL)/2=VCM, then the baseline count value K (VH)=K (VL)=Cb/Cfb. Once the sensing capacitor Cb cannot be evenly divided by the feedback capacitor Cfb, the count value will appear once more. After repeated P times, the count value will have a maximum error amount of P×1. Similarly, when the capacitance changes, the corresponding sensed count value K'(VH)=K'(VL)=(Cb+Δ Cb)/Cfb can be obtained. After repeated P times, the count value will have a maximum error amount of P×1.

The above problems need to be further overcome to improve the accuracy when performing multiple counts in dual edge sensing.

SUMMARY OF THE INVENTION

Therefore, the invention provides a capacitive touch sensing circuit to solve the problems occurred in the prior arts.

An embodiment of the invention is a capacitive touch sensing circuit. In this embodiment, the capacitive touch sensing circuit includes a first switch, a second switch, a third switch, a fourth switch, a fifth switch, a sixth switch, a seventh switch, an eighth switch, a ninth switch, a tenth switch, an eleventh switch, a twelfth switch, a thirteen switch, a fourteen switch, an operational amplifier, a comparator, a sensing capacitor, a feedback capacitor, an amplifier capacitor and a mutual capacitor. The first switch and the second switch are coupled in series between a first voltage and a second voltage, and the first voltage is higher than the second voltage. One terminal of the sensing capacitor is coupled between the first switch and the second switch and the other terminal of the sensing capacitor is coupled to a ground terminal. One terminal of the third switch is coupled between the first switch and the second switch and coupled to the mutual capacitor and the seventh switch respectively and the other terminal of the third switch is coupled to a negative input terminal of the operational amplifier. One terminal of the fourth switch is coupled to the negative input terminal of the operational amplifier and the other terminal of the fourth switch is coupled to the fifth switch, the sixth switch and the feedback capacitor respectively. The fifth switch is coupled between the first voltage and the fourth switch. The sixth switch is coupled between the second voltage and the fourth switch. One terminal of the seventh switch is coupled to a reference voltage and the other terminal of the seventh switch is coupled to the third switch and the mutual capacitor. The eighth switch and the ninth switch are coupled in series between the first voltage and the second voltage. One terminal of the mutual capacitor is coupled between the eighth switch and the ninth switch and the other terminal of the mutual capacitor is coupled to the third switch and the seventh switch. The tenth switch is coupled between a first node and a second node. The first node is coupled between the negative input terminal of the operational amplifier and the third switch. The second node is coupled between the output terminal of the operational amplifier and a positive input terminal of the comparator. The amplifier capacitor is coupled between the third node and the fourth node. The eleventh switch is coupled between the first node and the third node. The twelfth switch is coupled between the second node and the fourth node. The thirteenth switch is coupled between the third node and the second node. The fourteenth switch is coupled between the fourth node and the first node. The negative input terminal of the operational amplifier is coupled to the third switch, the fourth switch and the first node. The positive input terminal of the operational amplifier is coupled to a common-mode voltage. The output terminal of the operational amplifier is coupled to the positive input terminal of the comparator and the second node and outputs an output voltage. The positive input terminal of the comparator is coupled to the output terminal of the operational amplifier and the second node. The negative input terminal of the comparator is coupled to the common-mode voltage. The output terminal of the comparator outputs a comparator output signal to a compensation unit, and the compensation unit includes the fourth switch, the fifth switch, the sixth switch and the feedback capacitor. The capacitive touch sensing circuit can be operated in a first charge phase, a first transfer phase, a second charge phase and a second transfer phase in order.

In an embodiment, when the self-capacitance touch sensing circuit is operated in the first charge phase, the second switch, the fifth switch, the tenth switch, the eleventh switch and the twelfth switch are conducted and the first switch, the third switch, the fourth switch, the sixth switch to the ninth switch, the thirteenth switch and the fourteenth switch are not conducted.

In an embodiment, since the second switch is conducted, the sensing capacitor is coupled between the second voltage and the ground terminal, and since the fifth switch is conducted, the feedback capacitor is coupled between the first voltage and the ground terminal, a voltage received by the negative input terminal of the operational amplifier is 0 and the positive input terminal of the operational amplifier is coupled to the common-mode voltage, and the output voltage outputted by the output terminal of the operational amplifier is equal to the common-mode voltage.

In an embodiment, when the self-capacitance touch sensing circuit is operated in the first transfer phase, the third switch, the fifth switch, the eleventh switch and the twelfth switch are conducted and the first switch, the second switch, the fourth switch, the sixth switch to the tenth switch, the thirteenth switch and the fourteenth switch are not conducted.

In an embodiment, since the third switch is conducted, the sensing capacitor is coupled between the negative input terminal of the operational amplifier and the ground terminal, and the output voltage is equal to {the common-mode voltage−[(the second voltage−the common-mode voltage)× the sensing capacitor/the amplifier capacitor]}.

In an embodiment, when the self-capacitance touch sensing circuit counts in the first transfer phase, the third switch, the fourth switch, the eleventh switch and the twelfth switch are conducted and the first switch, the second switch, the fifth switch to the tenth switch, the thirteenth switch and the fourteenth switch are not conducted.

In an embodiment, since the fourth switch is conducted, the feedback capacitor is coupled to the negative input terminal of the operational amplifier; if the self-capacitance touch sensing circuit counts K times before the first transfer phase ends, the output voltage is equal to {the common-mode voltage −[(the second voltage−the common-mode voltage)×the sensing capacitor/the amplifier capacitor]+[K× (the common-mode voltage−the first voltage)×the feedback capacitor/the amplifier capacitor], K is a positive integer.

In an embodiment, when the self-capacitance touch sensing circuit is operated in the second charge phase, the first switch, the sixth switch, and the tenth switch are conducted, and the second switch to the fifth switch, the seventh switch to the ninth switch and the eleventh switch to the fourteenth switch are not conducted.

In an embodiment, since the first switch is conducted, the sensing capacitor is coupled between the first voltage and the ground terminal, and since the sixth switch is conducted, the feedback capacitor is coupled between the second voltage and the ground terminal; after the self-capacitance touch sensing circuit counts K times, an amount of charges stored in the amplifier capacitor is {[K×(the first voltage−the common-mode voltage)×the feedback capacitor/the amplifier capacitor−(the common-mode voltage−the second voltage)×the sensing capacitor/the amplifier capacitor]×the amplifier capacitor}, and the output voltage outputted by the output terminal of the operational amplifier is equal to the common-mode voltage.

In an embodiment, when the self-capacitance touch sensing circuit is operated in the second transfer phase, the third switch, the sixth switch, the thirteenth switch and the fourteenth switch are conducted, and the first switch to the second switch, the fourth switch to the fifth switch and the seventh switch to the twelfth switch are not conducted.

In an embodiment, since the third switch is turned on, the detection capacitor is coupled between the negative input terminal and the ground terminal of the operational amplifier, and the output voltage is equal to the common mode voltage−[(the first voltage−the common mode voltage)×the detection capacitor/the amplifier capacitor]+[K×(the first voltage−the common mode voltage)×the feedback capacitor/the amplifier capacitor−(the common mode capacitor− the second voltage)×the detection capacitor Measure capacitance/Capacitance of this amplifier].

In an embodiment, when the self-capacitance touch sensing circuit counts in the second transfer phase, the third switch, the fourth switch, the thirteenth switch and the fourteenth switch are conducted, and the first switch, the second switch, the fifth switch to the twelfth switch are not conducted.

In an embodiment, since the fourth switch is conducted, the feedback capacitor is coupled to the negative input terminal of the operational amplifier, and the output voltage is equal to {the common-mode voltage−[(the first voltage− the common-mode voltage)×the sensing capacitor/the amplifier capacitor]+[K×(the first voltage−the common-mode voltage)×the feedback capacitor/the amplifier capacitor−(the common-mode voltage−the second voltage)×the sensing capacitor/the amplifier capacitor]+[(the common-mode voltage−the second voltage)×the feedback capacitance/the amplifier capacitance]}.

In an embodiment, if the self-capacitance touch sensing circuit counts M times before the second transfer phase ends, the output voltage is equal to {the common-mode voltage−[(the first voltage−the common-mode voltage)×the sensing capacitor/the amplifier capacitance]+[K×(the first voltage−the common-mode voltage)×the feedback capacitance/the amplifier capacitance−(the common-mode voltage−the second voltage)×the sensing capacitance/the amplifier capacitance]+[M×(the common-mode voltage−the second voltage)×the feedback capacitance/the amplifier capacitance]}, and M is a positive integer.

In an embodiment, in a case that (the first voltage+the second voltage)/2 is equal to the common-mode voltage, when [(the common-mode voltage−the second voltage)×the sensing capacitor]/[(the first voltage−the common-mode voltage)×the feedback capacitance] is not an integer, then M and K are not equal.

Compared to the prior art, the capacitive touch sensing circuit of the invention provides an innovative self-capacitance sensing method to add the switch to change the polarities of the amplifier capacitor (Cop) in the capacitive digital converter (CDC) and operate with an oversampling circuit having an automatic charge compensation mechanism. The capacitive touch sensing circuit of the invention can achieve the following effects and advantages of:

(1) effectively reducing the amount of errors when the capacitive digital converter (CDC) performs multiple counts in dual edge sensing to improve the accuracy when performing the multiple counts in the dual edge sensing;
(2) when the time of the transfer phase is insufficient to complete the counting, the residual charges on the amplifier can be kept to be counted at the next transfer phase; and
(3) since the error of noise becomes smaller, the signal-to-noise ratio can be directly improved.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

An embodiment of the invention is a capacitive touch sensing circuit. In this embodiment, the capacitive touch sensing circuit is a self-capacitance touch sensing circuit, but not limited to this.

Figure 1:
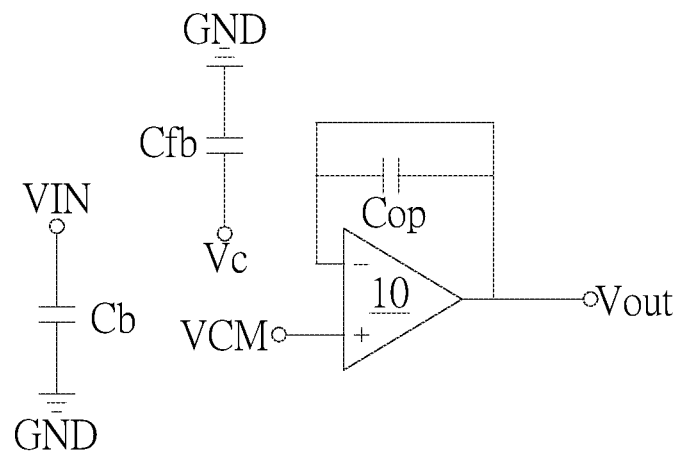
FIG. 1 is a schematic diagram of the conventional self-capacitance touch sensing circuit operated in the charge phase.
Figure 2:
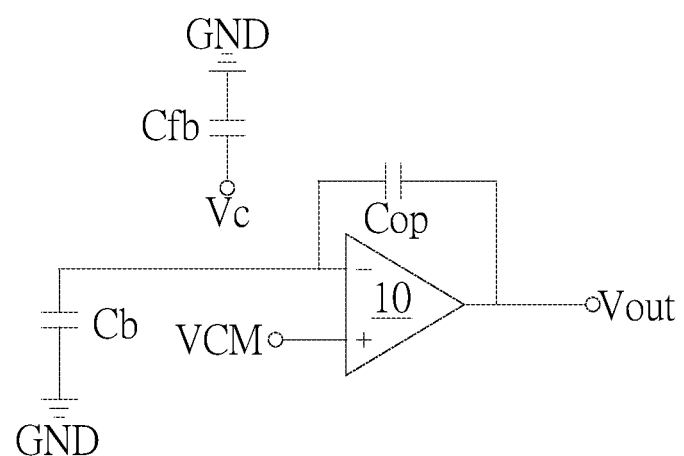
FIG. 2 is a schematic diagram of the conventional self-capacitance touch sensing circuit operated in the transfer phase.
Figure 3:
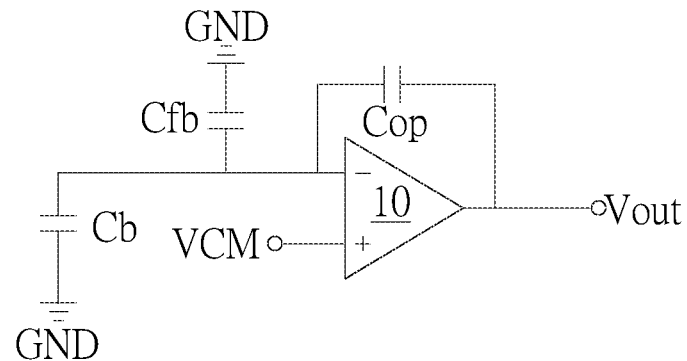
FIG. 3 is a schematic diagram of the conventional self-capacitance touch sensing circuit compensated in the transfer phase.
Figure 4:
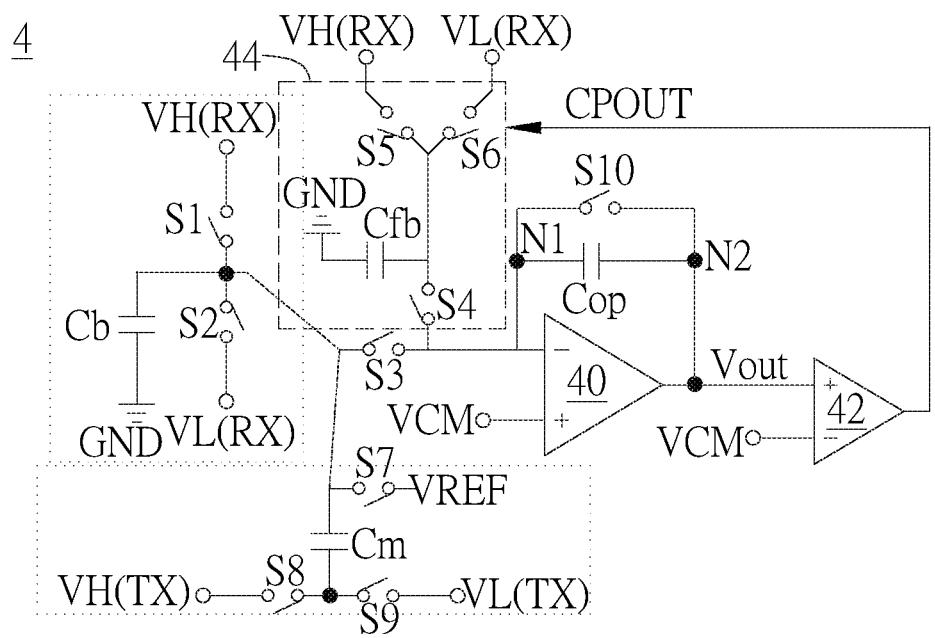
FIG. 4 is a schematic diagram of the conventional capacitive digital converter (CDC) used for capacitance sensing.
Figure 5:
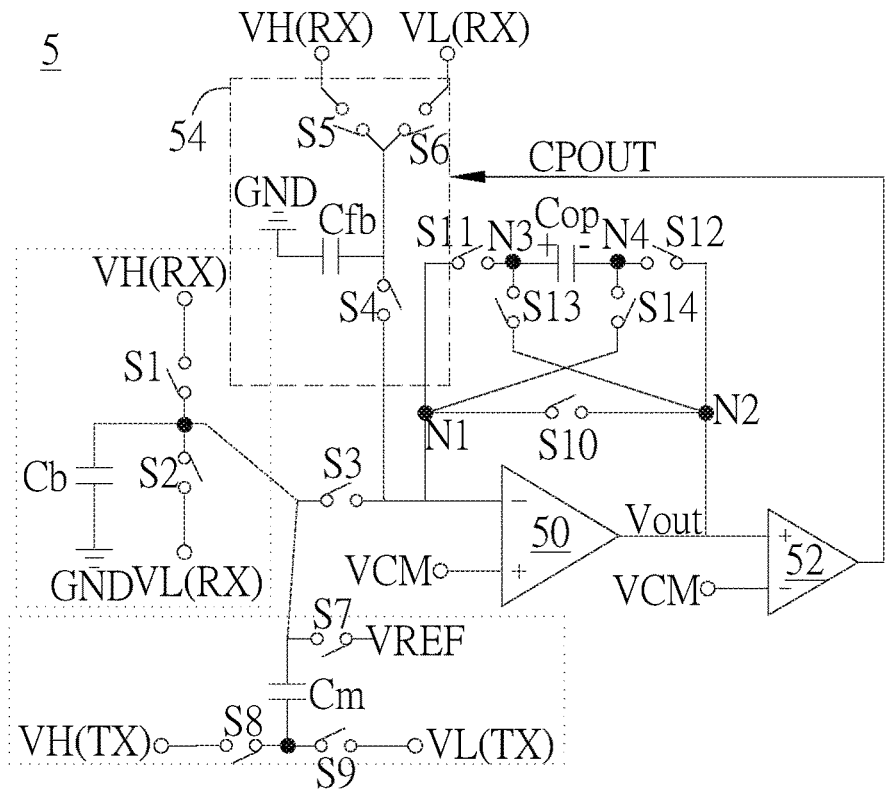
FIG. 5 is a schematic diagram of the self-capacitance touch sensing circuit in a preferred embodiment of the invention.

Please refer to FIG. 5. FIG. 5 is a schematic diagram of the capacitive touch sensing circuit 5 in this embodiment.

As shown in FIG. 5, the capacitive touch sensing circuit 5 can include a first switch S1 to a fourteenth switch S14, an operational amplifier 50, a comparator 52, a sensing capacitor Cb, a feedback capacitor Cfb, an amplifier capacitor Cop and a mutual capacitor Cm.

The first switch S1 and the second switch S2 are coupled in series between high-voltage (the receiving terminal) VH (RX) and low-voltage (the receiving terminal) VL (RX); one terminal of the sensing capacitor Cb is coupled between the first switch S1 and the second switch S2 and the other terminal of the sensing capacitor Cb is coupled to the ground terminal GND; one terminal of the third switch S3 is coupled between the first switch S1 and the second switch S2 and coupled to the mutual capacitor Cm and the seventh switch S7, and the other terminal of the third switch S3 is coupled to the negative input terminal − of the operational amplifier 50; one terminal of the fourth switch S4 is coupled to the negative input terminal − of the operational amplifier 50 and the other terminal of the fourth switch S4 is coupled to the fifth switch S5, the sixth switch S6, and the feedback capacitor Cfb respectively.

The fifth switch S5 is coupled between high-voltage (the receiving terminal) VH (RX) and the fourth switch S4; the sixth switch S6 is coupled between low-voltage (the receiving terminal) VL (RX) and the fourth switch S4; one terminal of the seventh switch S7 is coupled to the reference voltage VREF and the other terminal is coupled to the third switch S3 and the mutual capacitor Cm; the eighth switch S8 and the ninth switch S9 are coupled in series between high-voltage (the transmitting terminal) VH (TX) and low-voltage (the transmitting terminal) VL (TX); one terminal of the mutual capacitor Cm is coupled between the eighth switch S8 and the ninth switch S9 and the other terminal of the mutual capacitor Cm is coupled to the third switch S3 and the seventh switch S7.

The tenth switch S10 is coupled between the first node N1 and the second node N2; the first node N1 is coupled between the negative input terminal − of the operational amplifier 50 and the third switch S3; the second node N2 is coupled between the output terminal of the operational amplifier 50 and the positive input terminal + of the comparator 52; the amplifier capacitor Cop is coupled between the third node N3 and the fourth node N4; the eleventh switch S11 is coupled between the first node N1 and the third node N3; the twelfth switch S12 is coupled between the second node N2 and the fourth node N4; the thirteenth switch S13 is coupled between the third node N3 and the second node N2; the fourteenth switch S14 is coupled between the fourth node N4 and the first node N1.

The negative input terminal − of the operational amplifier 50 is coupled to the third switch S3, the fourth switch S4 and the first node N1; the positive input terminal + of the operational amplifier 50 is coupled to the common-mode voltage VCM; the output terminal of the operational amplifier 50 is coupled to the positive input terminal + of the comparator 52 and the second node N2 and outputs an output voltage Vout; the positive input terminal + of the comparator 52 is coupled to the output terminal of the operational amplifier 50 and the second node N2; the negative input terminal − of the comparator 52 is coupled to the common-mode voltage VCM; the output terminal of the comparator 52 outputs a comparator output signal CPOUT to the compensation unit 54, and the compensation unit 54 includes a fourth switch S4, a fifth switch S5, a sixth switch S6 and a feedback capacitor Cfb.

It should be noted that the capacitive touch sensing circuit 5 can be sequentially operated in the first charge phase, the first transfer phase, the second charge phase and the second transfer phase, and the capacitive touch sensing circuit 5 can perform multiple counts in the first transfer phase and the second transfer phase. Each of the above-mentioned phases will be described in detail below.

Figure 6:
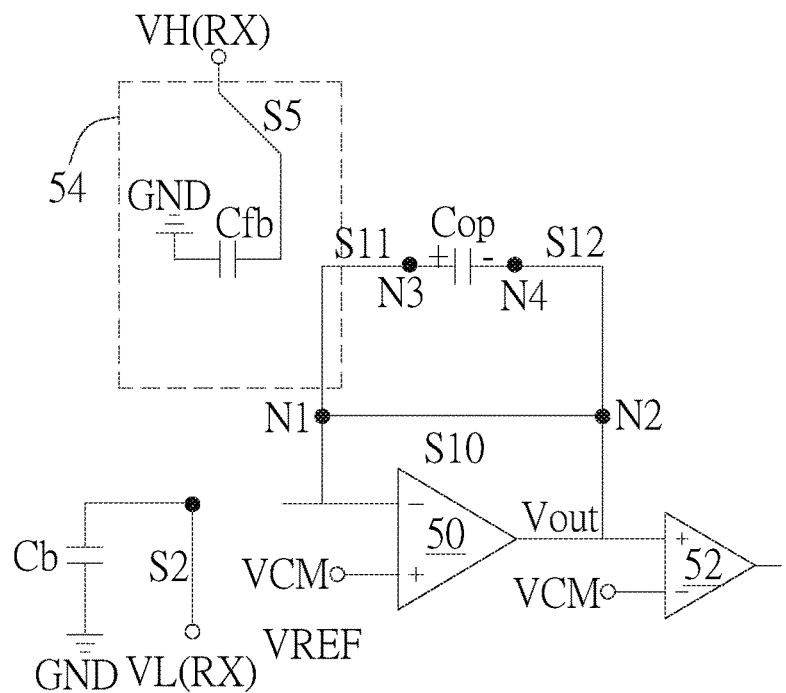
FIG. 6 is a schematic diagram of the self-capacitance touch sensing circuit operated in the first charge phase in the invention.

At first, please refer to FIG. 6. FIG. 6 is a schematic diagram illustrating the self-capacitance touch sensing circuit 5 operated in the first charge phase. For the convenience of viewing, FIG. 6 omits the non-conducting switches and only shows the conducting switches.

As shown in FIG. 6, when the self-capacitance touch sensing circuit 5 is operated in the first charge phase, among the first switch S1 to the fourteenth switch S14, there are only the second switch S2, the fifth switch. S5, the tenth switch S10, the eleventh switch S11 and the twelfth switch S12 are conducted, and the first switch S1, the third switch S3, the fourth switch S4, the sixth switch S6 to the ninth switch S9, the thirteenth switch S13 and the fourteenth switch S14 are not conducted.

Since the second switch S2 is conducted, the sensing capacitor Cb is coupled between low-voltage (the receiving terminal) VL(RX) and the ground terminal GND, and because the fifth switch S5 is conducted, the feedback capacitor Cfb is coupled between high-voltage (the receiving terminal) VH(RX) and the ground terminal GND; therefore, the low-voltage VL charges the sensing capacitor Cb, so that the amount of charges stored in the sensing capacitor Cb is VL×Cb; the high-voltage VH charges the feedback capacitor Cfb, so that the amount of charges stored in the feedback capacitor Cfb is VH×Cfb. The voltage received by the negative input terminal − of the operational amplifier 50 is 0 and the positive input terminal + of the operational amplifier 50 is coupled to the common-mode voltage VCM. The output voltage Vout outputted by the output terminal of the operational amplifier 50 is equal to the common-mode voltage VCM.

Figure 7:
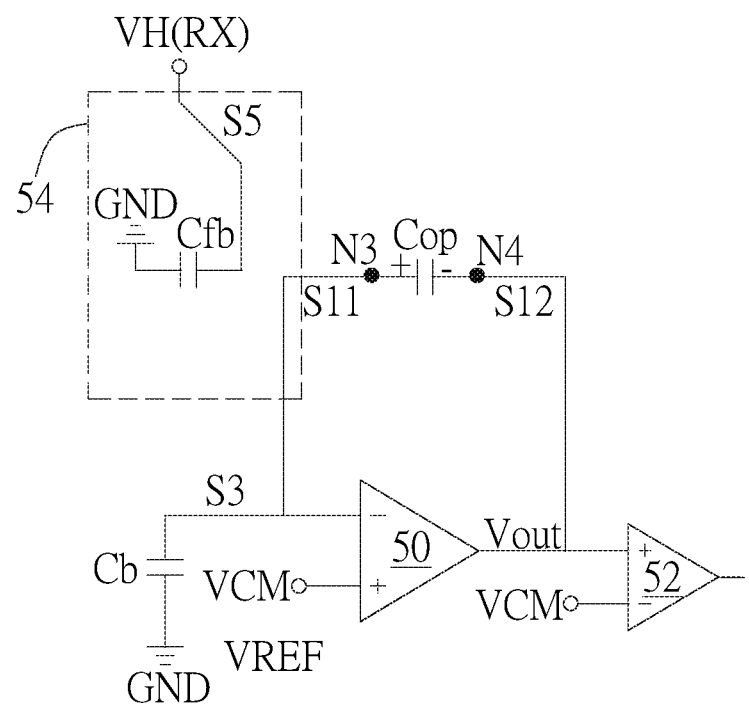
FIG. 7 is a schematic diagram of the self-capacitance touch sensing circuit operated in the first transfer phase in the invention.

Next, please refer to FIG. 7. FIG. 7 is a schematic diagram illustrating the self-capacitance touch sensing circuit 5 operated in the first transfer phase. For the convenience of viewing, FIG. 7 omits the non-conducting switches and only shows the conducting switches.

As shown in FIG. 7, when the self-capacitance touch sensing circuit 5 operated in the first transfer phase, among the first switch S1 to the fourteenth switch S14, there are only the third switch S3, the fifth switch. S5, the eleventh switch S11 and the twelfth switch S12 are conducted, and the first switch S1, the second switch S2, the fourth switch S4, the sixth switch S6 to the tenth switch S10, the thirteenth switch S13 and the fourteen switch S14 are not conducted.

Since the third switch S3 is conducted, the sensing capacitor Cb is coupled between the negative input terminal − of the operational amplifier 50 and the ground terminal GND, and the following Equation 9 can be obtained:

$$VL \times Cb = VCM \times Cb + (VCM - Vout) \times Cop; \text{ that is,}$$

the output voltage $Vout = VCM - [(VL - VCM) \times Cb/Cop]$  Equation 9

The amount of charges stored in the feedback capacitor Cfb is still VH×Cfb.

Figure 7A:
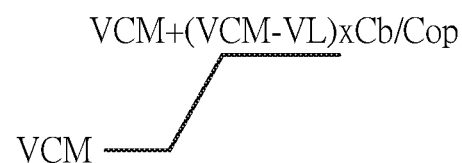
FIG. 7A illustrates the variation of the output voltage Vout in FIG. 7.

As shown in FIG. 7A, the output voltage Vout outputted by the operational amplifier 50 will increase from VCM in the first charge phase to VCM+[(VCM−VL)×Cb/Cop] in the first transfer phase.

Figure 8:
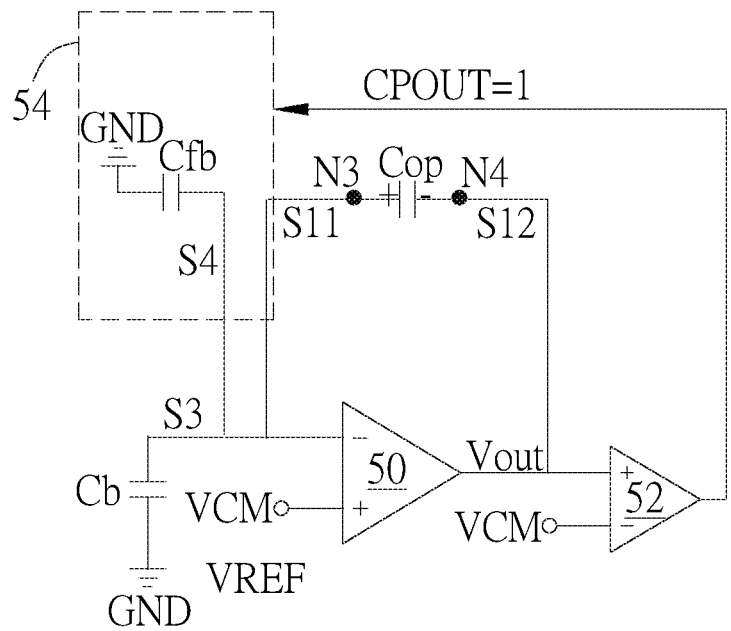
FIG. 8 is a schematic diagram of the self-capacitance touch sensing circuit counting in the first transfer phase in the invention.

Next, please refer to FIG. 8. FIG. 8 is a schematic diagram of the self-capacitance touch sensing circuit 5 counting in the first transfer phase. For the convenience of viewing, FIG. 8 omits the non-conducting switches and only shows the conducting switches.

As shown in FIG. 8, when the self-capacitance touch sensing circuit 5 counts under the first transfer phase, among the first switch S1 to the fourteenth switch S14, only the third switch S3, the fourth switch S4, the eleventh switch S11 and the twelfth switch S12 are conducted, and the first switch S1, the second switch S2, the fifth switch S5 to tenth switch S10, the thirteenth switch S13 and the fourteenth switch S14 are not conducted.

Since the fourth switch S4 is conducted, the amount of charges VH×Cfb stored in the feedback capacitor Cfb of the compensation unit 54 can flow to the negative input terminal − of the operational amplifier 50 for a single compensation, the following Equation 10 can be obtained:

$$VL \times Cb + VH \times Cfb = VCM \times Cb + (VCM - Vout) \times Cop + VCM \times Cfb; \text{ that is the output voltage}$$
$$Vout = VCM - [(VL - VCM) \times Cb/Cop] + [(VCM - VH) \times Cfb/Cop]$$  Equation 10

Figure 8A:
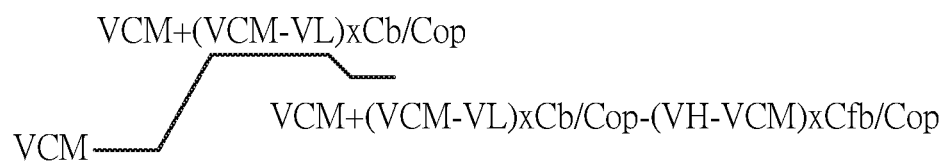
FIG. 8A illustrates the variation of the output voltage Vout in FIG. 8.

After the above-mentioned single compensation is performed in the first transfer phase, as shown in FIG. 8A, the output voltage Vout outputted by the operational amplifier 50 will decrease from VCM+[(VCM−VL)×Cb/Cop] to VCM+(VCM−VL)×Cb/Cop−(VH−VCM)×Cfb/Cop.

Assuming that the self-capacitance touch sensing circuit 5 counts K times before the end of the first transfer phase (K is a positive integer), then the output voltage Vout $$=VCM-[(VL-VCM) \times Cb/Cop]+[K \times (VCM-VH) \times Cfb/Cop]$$

Equation 11

Figure 9:
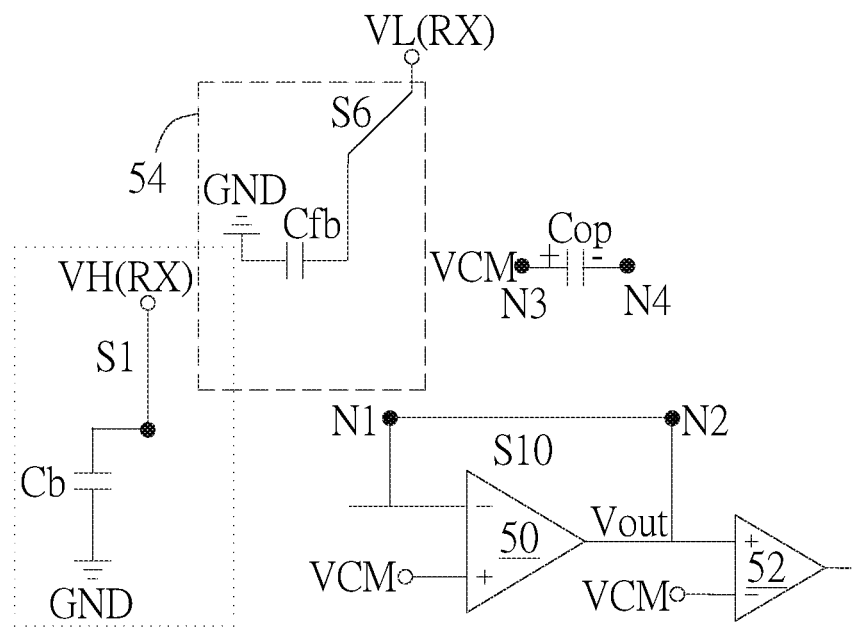
FIG. 9 is a schematic diagram of the self-capacitance touch sensing circuit operated in the second charge phase in the invention.

Next, please refer to FIG. 9. FIG. 9 is a schematic diagram illustrating the self-capacitance touch sensing circuit 5 operated in the second charge phase. For the convenience of viewing, FIG. 9 omits the non-conducting switches and only shows the conducting switches.

As shown in FIG. 9, when the self-capacitance touch sensing circuit 5 is operated in the second charge phase, among the first switch S1 to the fourteenth switch S14, there are only the first switch S1, the sixth switch S6 and the tenth switch S10 are conducted, and the second switch S2 to the fifth switch S5, the seventh switch S7 to the ninth switch S9 and the eleventh switch S11 to the fourteenth switch S14 are not conducted.

Since the first switch S1 is conducted, the sensing capacitor Cb is coupled between the high-voltage (the receiving terminal) VH(RX) and the ground terminal GND, and because the sixth switch S6 is conducted, the feedback capacitor Cfb is coupled between the low-voltage (the receiving terminal) VL(RX) and the ground terminal GND; therefore, the high-voltage VH charges the sensing capacitor Cb, so that the amount of charges stored in the sensing capacitor Cb is VH×Cb; the low-voltage VL charges the feedback capacitor Cfb, so that the amount of charges stored in the feedback capacitor Cfb is VL×Cfb.

After counting K times before the end of the first transfer phase, the amount of charges stored in the amplifier capacitor Cop is [K×(VH−VCM)×Cfb/Cop−(VCM−VL)×Cb/Cop]×Cop and the output voltage Vout outputted by the output terminal of the operational amplifier 50 is equal to the common-mode voltage VCM.

Figure 9A:
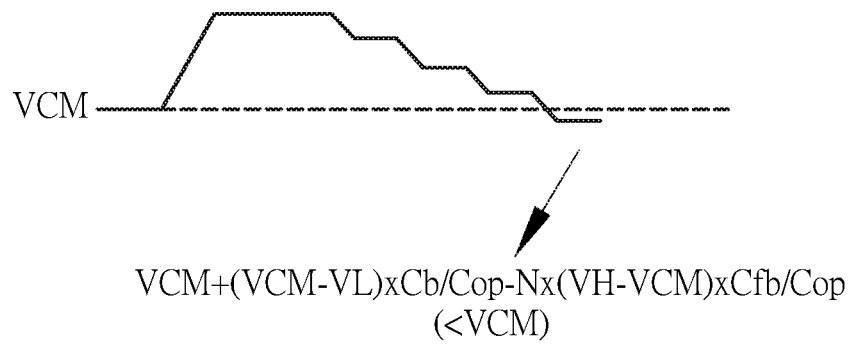
FIG. 9A illustrates the variation of the voltage at the fourth node N4 in FIG. 9.

As shown in FIG. 9A, after counting K times before the end of the first transfer phase, the voltage of the third node N3 on one side of the amplifier capacitor Cop is equal to the common-mode voltage VCM and the voltage of the fourth node N4 on the other side of the amplifier capacitor Cop is equal to VCM+(VCM−VL)×Cb/Cop−K×(VH−VCM)×Cfb/Cop.

Figure 10:
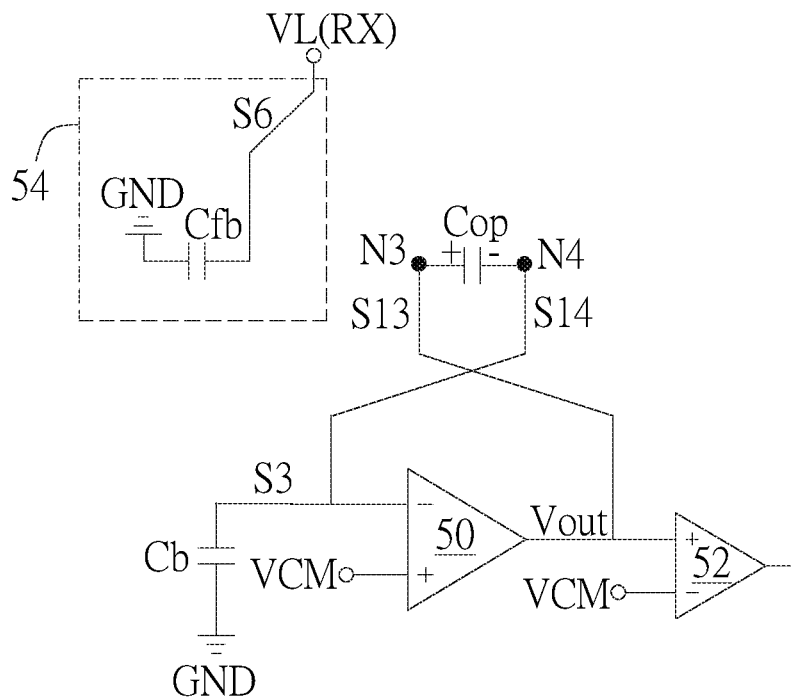
FIG. 10 is a schematic diagram of the self-capacitance touch sensing circuit counting in the second transfer phase in the invention.

Next, please refer to FIG. 10. FIG. 10 is a schematic diagram illustrating the self-capacitance touch sensing circuit 5 operated in the second transfer phase. For the convenience of viewing, FIG. 10 omits the non-conducting switches and only shows the conducting switches.

As shown in FIG. 10, when the self-capacitance touch sensing circuit 5 is operated in the second transfer phase, among the first switch S1 to the fourteenth switch S14, there are only the third switch S3, the sixth switch S6, the thirteenth switch S13 and the fourteenth switch S14 are conducted, and the first switch S1 to second switch S2, the fourth switch S4 to the fifth switch S5 and the seventh switch S7 to the twelfth switch S12 are not conducted.

Since the third switch S3 is conducted, the sensing capacitor Cb is coupled between the negative input terminal − of the operational amplifier 50 and the ground terminal GND, and the following Equation 12 can be obtained:

$$VH \times Cb - [K \times (VH-VCM) \times Cfb/Cop - (VCM-VL) \times Cb/Cop] \times Cop = VCM \times Cb + (VCM-Vout) \times Cop$$

That is, the output voltage $Vout = VCM - [(VH-VCM) \times Cb/Cop] + [K \times (VH-VCM) \times Cfb/Cop - (VCM-VL) \times Cb/Cop]$ Equation 12

And, the amount of charges stored in the feedback capacitor Cfb is still VL×Cfb.

Figure 10A:
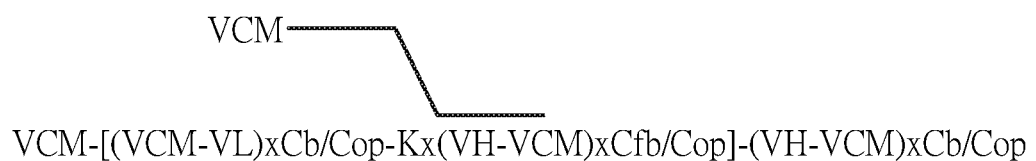
FIG. 10A and FIG. 10B illustrate the variation of the voltage at the third node N3 and the fourth node N4 in FIG. 10 respectively.
Figure 10B:
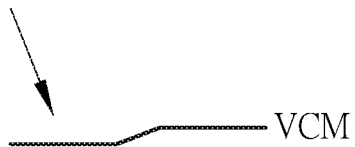

As shown in FIG. 10A and FIG. 10B, the voltage of the third node N3 on one side of the amplifier capacitor Cop will drop from the common-mode voltage VCM to VCM−[(VCM−VL)×Cb/Cop−K×(VH−VCM)×Cfb/Cop]−(VH−VCM)×Cb/Cop and the voltage of the fourth node N4 on the other side of the amplifier capacitor Cop will rise from VCM+(VCM−VL)×Cb/Cop−K×(VH−VCM)×Cfb/Cop to the common-mode voltage VCM.

Figure 11:
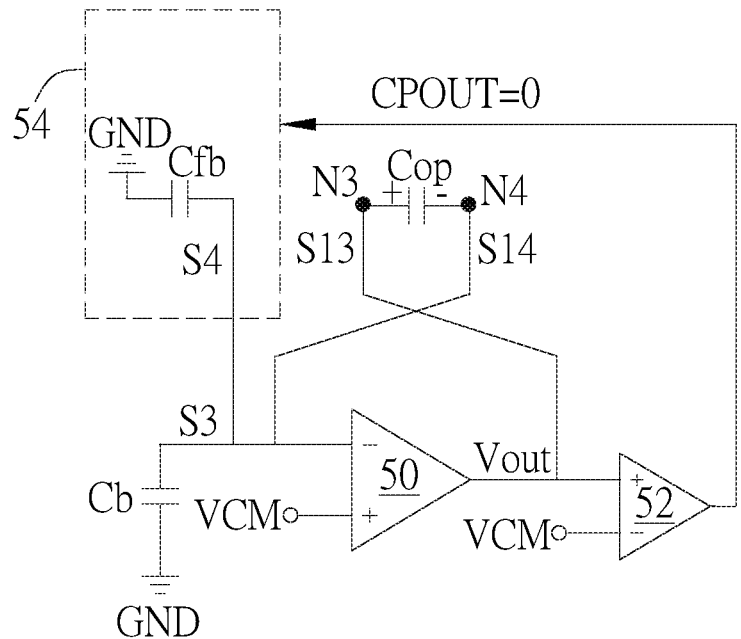
FIG. 11 is a schematic diagram of the self-capacitance touch sensing circuit counting in the second transfer phase in the invention.

Next, please refer to FIG. 11. FIG. 11 is a schematic diagram showing that the self-capacitance touch sensing circuit 5 counts in the second transfer phase. For the convenience of viewing, FIG. 11 omits the non-conducting switches and only shows the conducting switches.

As shown in FIG. 11, when the self-capacitance touch sensing circuit 5 counts in the second transfer phase, among the first switch S1 to the fourteenth switch S14, only the third switch S3, the fourth switch S4, the thirteenth switch S13 and the fourteenth switch S14 are conducted, and the first switch S1, the second switch S2 and the fifth switch S5 to the twelfth switch S12 are not conducted.

Since the fourth switch S4 is conducted, the amount of charges VL×Cfb stored in the feedback capacitor Cfb in the compensation unit 54 can flow to the negative input terminal − of the operational amplifier 50 for a single compensation, the following Equation 13 is obtained:

$$VH \times Cb - [K \times (VH-VCM) \times Cfb/Cop - (VCM-VL) \times Cb/Cop] + VL \times Cfb = VCM \times Cb + (VCM-Vout) \times Cop + VCM \times Cfb; \text{ that is}$$

the output voltage $Vout = VCM - [(VH-VCM) \times Cb/Cop] + [K \times (VH-VCM) \times Cfb/Cop - (VCM-VL) \times Cb/Cop] + [(VCM-VL) \times Cfb/Cop]$ Equation 13

Figure 11A:
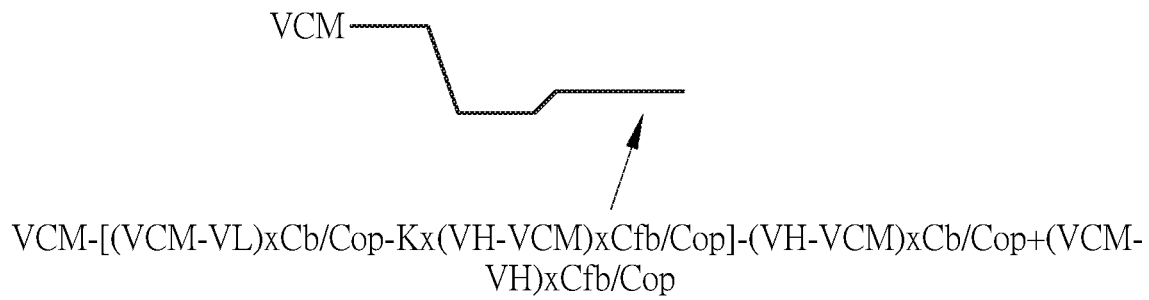
FIG. 11A and FIG. 11B illustrate the variation of the voltage at the third node N3 and the fourth node N4 in FIG. 11 respectively.
Figure 11B:
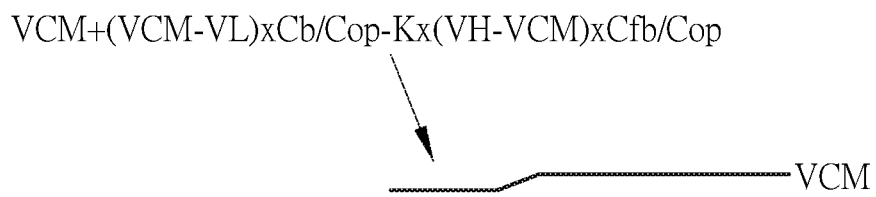

After the above-mentioned single-time compensation is performed in the second transfer phase, as shown in FIG. 11A and FIG. 11B, the voltage of the third node N3 on one side of the amplifier capacitor Cop will rise from VCM−[(VCM−VL)×Cb/Cop−K×(VH−VCM)×Cfb/Cop]−(VH−VCM)×Cb/Cop to VCM−[(VCM−VL)×Cb/Cop−K×(VH−VCM)×Cfb/Cop]−(VH−VCM)×Cb/Cop+(VCM−VH)×Cfb/Cop. In addition, the voltage of the fourth node N4 on the other side of the amplifier capacitor Cop is still maintained at the common-mode voltage VCM.

Assuming that the self-capacitance touch sensing circuit 5 counts M times (M is a positive integer) before the end of the second transfer phase, the output voltage Vout $$=VCM-[(VH-VCM) \times Cb/Cop]+[K \times (VH-VCM) \times Cfb/Cop-(VCM-VL) \times Cb/Cop]+[M \times (VCM-VL) \times Cfb/Cop]$$

Equation 14

If the average value of the high-voltage VH and the low-voltage VL is equal to the common-mode voltage VCM, that is, in the case of (VH+VL)/2=VCM, when [(VCM−VL)×Cb]/[(VH−VCM)×Cfb] is not an integer, then M is not equal to K (for example, K is greater than M, but not limited to this).

Compared with the conventional self-capacitance touch sensing circuit, when the sensing capacitance Cb cannot be divided by the feedback capacitance Cfb, an additional count value appears, so that the self-capacitance touch sensing circuit 5 of the invention can obtain the sensing amount accurately.

For example, if the indivisible 9.5 is taken as an example, the count value K of the conventional self-capacitance touch sensing circuit is 10, then 2×K=20 is significantly greater than 2×9.5=19, and if the count value K of the self-capacitance touch sensing circuit 5 is 10 and M=9, then K+M=19 is equal to 2×9.5=19.

Figure 12:
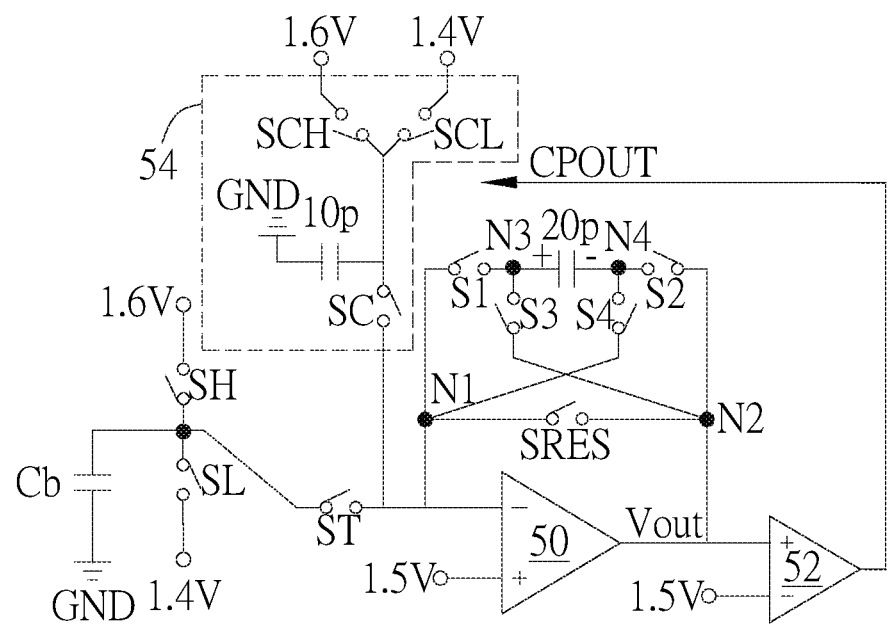
FIG. 12 and FIG. 13 illustrate timing diagrams of the simulation setting and the simulation result of the self-capacitance touch sensing circuit in the invention respectively.
Figure 13:
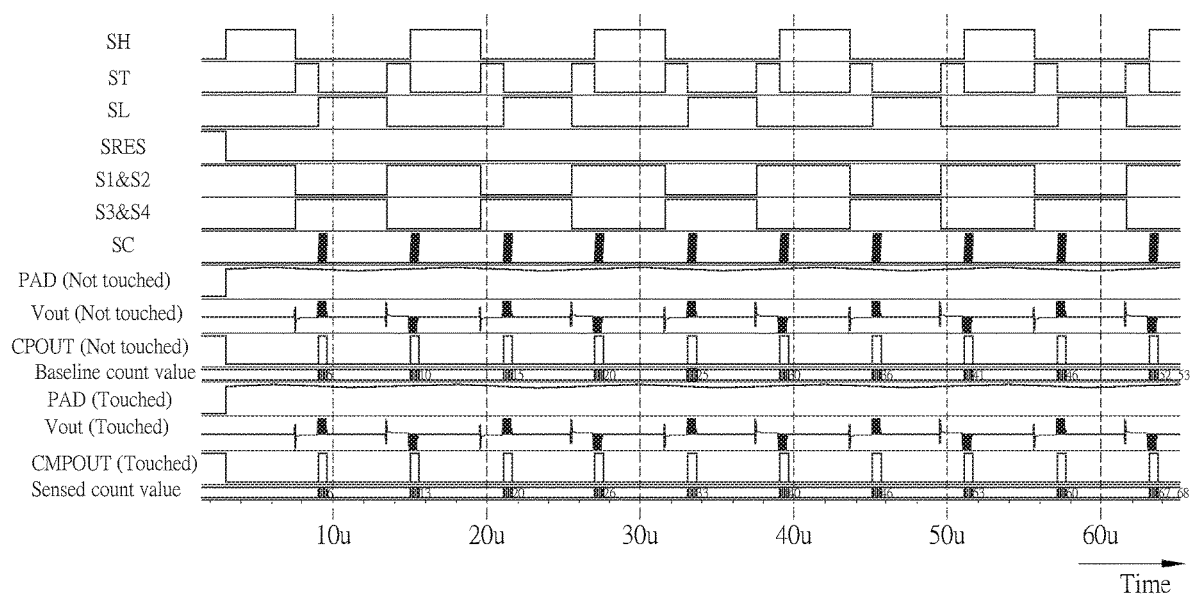

Please refer to FIG. 12 and FIG. 13. FIG. 12 and FIG. 13 are timing diagrams illustrating the simulation setting and simulation result of the self-capacitance touch sensing circuit of the invention respectively.

As shown in FIG. 12, the switch SH and the switch SL are coupled in series between high-voltage (1.6V) and low-voltage (1.4V), and one terminal of the sensing capacitor Cb is coupled between the switch SH and the switch SL and the other terminal of the sensing capacitor Cb is coupled to the ground terminal GND. One terminal of the switch ST is coupled between the switch SH and the switch SL and the other terminal of the switch ST is coupled to the negative input terminal − of the operational amplifier 50. The positive input terminal + of the operational amplifier 50 and the negative input terminal − of the comparator 52 are both coupled to the common-mode voltage (1.5V). The switch SRES is coupled between the first node N1 and the second node N2. The first node N1 is coupled to the negative input terminal − of the operational amplifier 50. The second node N2 is coupled to the output terminal of the operational amplifier 50. An output terminal of the operational amplifier 50 outputs an output voltage Vout. The output terminal of the comparator 52 outputs a comparator output signal CPOUT to the compensation unit 54. The switch S1 is coupled between the third node N3 and the first node N1. The switch S2 is coupled between the fourth node N4 and the second node N2. The switch S3 is coupled between the third node N3 and the second node N2. The switch S4 is coupled between the fourth node N4 and the first node N1. The switch SC is coupled between the switch ST and the negative input terminal − of the operational amplifier 50. The switch SCH is coupled between the high-voltage (1.6V) and the switch SC. The switch SCL is coupled between the low-voltage (1.4V) and the switch SC.

Assume that the capacitance value of the amplifier capacitor coupled between the third node N3 and the fourth node N4 is 20p; the capacitance value of the feedback capacitor coupled between the switch SC, the switch SCH, the switch SCL and the ground terminal GND is 10p; when the detection capacitor Cb is not touched, the capacitance value is 51p and when it is touched, the capacitance value becomes 66p.

According to the Equations, an ideal baseline count value is (10×51p×0.1)/(10p×0.1)=51 and the change amount of the ideal count value due to the capacitance change when being touched is (10×15p×0.1)/(10p×0.1)=15.

As can be seen from FIG. 13, the simulation result of the self-capacitance touch sensing circuit of the invention is that the baseline count value is 53 without being touched, and the sensed count value is 68 when being touched; that is, the baseline count value (53) without being touched is only twice more than the ideal baseline count value (51), and the change amount of the count value due to the capacitance change when being touched is 68−53=15 which is equal to the ideal count value change amount (15).

Figure 14:
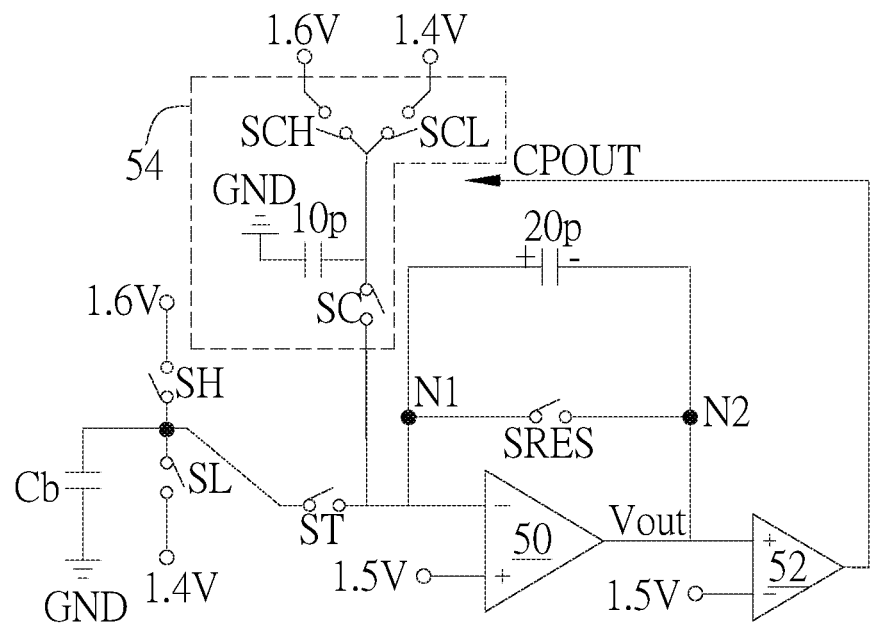
FIG. 14 and FIG. 15 illustrate timing diagrams of the simulation setting and the simulation result of the conventional self-capacitance touch sensing circuit respectively.
Figure 15:
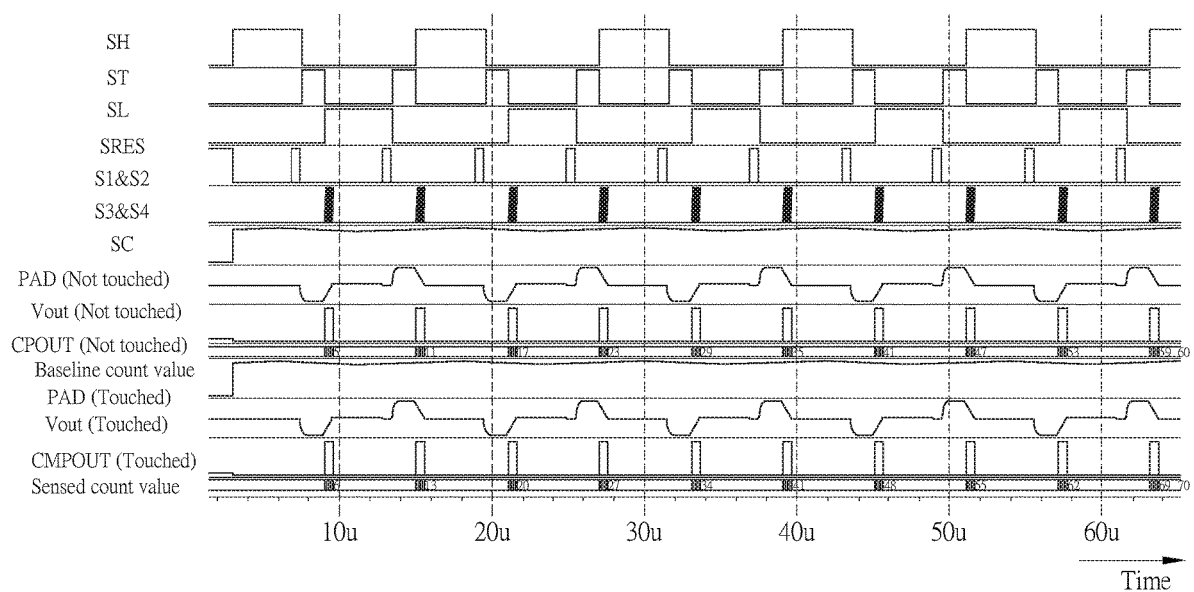

Please refer to FIG. 14 and FIG. 15. FIG. 14 and FIG. 15 are timing diagrams illustrating the simulation setting and simulation result of a conventional self-capacitance touch sensing circuit respectively.

As shown in FIG. 14, the switch SH and the switch SL are coupled in series between the high-voltage (1.6V) and the low-voltage (1.4V), and one terminal of the sensing capacitor Cb is coupled between the switch SH and the switch SL and the other terminal of the sensing capacitor Cb is coupled to the ground terminal GND. One terminal of the switch ST is coupled between the switch SH and the switch SL, and the other terminal of the switch ST is coupled to the negative input terminal − of the operational amplifier 50. The positive input terminal + of the operational amplifier 50 and the negative input terminal − of the comparator 52 are both coupled to the common-mode voltage (1.5V). The switch SRES is coupled between the first node N1 and the second node N2. The first node N1 is coupled to the negative input terminal − of the operational amplifier 50. The second node N2 is coupled to the output terminal of the operational amplifier 50. An output terminal of the operational amplifier 50 outputs an output voltage Vout. The output terminal of the comparator 52 outputs a comparator output signal CPOUT to the compensation unit 54. The switch SC is coupled between the switch ST and the negative input terminal − of the operational amplifier 50. The switch SCH is coupled between the high-voltage (1.6V) and the switch SC. The switch SCL is coupled between the low-voltage (1.4V) and the switch SC.

Assume that the capacitance value of the amplifier capacitor coupled between the first node N1 and the second node N2 is 20p; the capacitance value of the feedback capacitor coupled between the switch SC, the switch SCH, the switch SCL and the ground terminal GND is 10p; the capacitance value when the sensing capacitor Cb is not touched is 51p and the capacitance value when it is touched becomes 66p.

As can be seen from FIG. 15, the simulation result of the conventional self-capacitance touch sensing circuit is that the baseline count value without being touched is 60 and the sensed count value when being touched is 70; that is, the baseline count value (60) without being touched is obviously 9 times more than more than the ideal baseline count value (51), and the change amount of the count value due to the capacitance change when being touched is 70−60=10 which is significantly smaller than the ideal count value change amount (15).

Therefore, according to the simulation results of FIG. 13 and FIG. 15, it can be known that compared with the conventional self-capacitance touch sensing circuit, the self-capacitance touch sensing circuit of the invention can not only effectively reduce the amount of error of the baseline count value without being touched, but also avoid the change in the count value caused by the capacitance change becoming smaller.

Compared to the prior art, the capacitive touch sensing circuit of the invention provides an innovative self-capacitance sensing method to add the switch to change the polarities of the amplifier capacitor (Cop) in the capacitive digital converter (CDC) and operate with an oversampling circuit having an automatic charge compensation mechanism. The capacitive touch sensing circuit of the invention can achieve the following effects and advantages of:

(1) effectively reducing the amount of errors when the capacitive digital converter (CDC) performs multiple counts in dual edge sensing to improve the accuracy when performing the multiple counts in the dual edge sensing;

(2) when the time of the transfer phase is insufficient to complete the counting, the residual charges on the amplifier can be kept to be counted at the next transfer phase; and (3) since the error of noise becomes smaller, the signal-to-noise ratio can be directly improved.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A capacitive touch sensing circuit, comprising:
a first switch, a second switch, a third switch, a fourth switch, a fifth switch, a sixth switch, a seventh switch, an eighth switch, a ninth switch, a tenth switch, an eleventh switch, a twelfth switch, a thirteen switch and a fourteen switch;
an operational amplifier;
a comparator;
a sensing capacitor;
a feedback capacitor;
an amplifier capacitor; and
a mutual capacitor;
wherein the first switch and the second switch are coupled in series between a first voltage and a second voltage, and the first voltage is higher than the second voltage; one terminal of the sensing capacitor is coupled between the first switch and the second switch and the other terminal of the sensing capacitor is coupled to a ground terminal; one terminal of the third switch is coupled between the first switch and the second switch and coupled to the mutual capacitor and the seventh switch respectively and the other terminal of the third switch is coupled to a negative input terminal of the operational amplifier; one terminal of the fourth switch is coupled to the negative input terminal of the operational amplifier and the other terminal of the fourth switch is coupled to the fifth switch, the sixth switch and the feedback capacitor respectively; the fifth switch is coupled between the first voltage and the fourth switch; the sixth switch is coupled between the second voltage and the fourth switch; one terminal of the seventh switch is coupled to a reference voltage and the other terminal of the seventh switch is coupled to the third switch and the mutual capacitor; the eighth switch and the ninth switch are coupled in series between the first voltage and the second voltage; one terminal of the mutual capacitor is coupled between the eighth switch and the ninth switch and the other terminal of the mutual capacitor is coupled to the third switch and the seventh switch; the tenth switch is coupled between a first node and a second node; the first node is coupled between the negative input terminal of the operational amplifier and the third switch; the second node is coupled between the output terminal of the operational amplifier and a positive input terminal of the comparator; the amplifier capacitor is coupled between the third node and the fourth node; the eleventh switch is coupled between the first node and the third node; the twelfth switch is coupled between the second node and the fourth node; the thirteenth switch is coupled between the third node and the second node; the fourteenth switch is coupled between the fourth node and the first node; the negative input terminal of the operational amplifier is coupled to the third switch, the fourth switch and the first node; the positive input terminal of the operational amplifier is coupled to a common-mode voltage; the output terminal of the operational amplifier is coupled to the positive input terminal of the comparator and the second node and outputs an output voltage; the positive input terminal of the comparator is coupled to the output terminal of the operational amplifier and the second node; the negative input terminal of the comparator is coupled to the common-mode voltage; the output terminal of the comparator outputs a comparator output signal to a compensation unit, and the compensation unit comprises the fourth switch, the fifth switch, the sixth switch and the feedback capacitor; the capacitive touch sensing circuit can be operated in a first charge phase, a first transfer phase, a second charge phase and a second transfer phase in order.

2. The capacitive touch sensing circuit of claim 1, wherein when the self-capacitance touch sensing circuit is operated in the first charge phase, the second switch, the fifth switch, the tenth switch, the eleventh switch and the twelfth switch are conducted and the first switch, the third switch, the fourth switch, the sixth switch to the ninth switch, the thirteenth switch and the fourteenth switch are not conducted.

3. The capacitive touch sensing circuit of claim 2, wherein since the second switch is conducted, the sensing capacitor is coupled between the second voltage and the ground terminal, and since the fifth switch is conducted, the feedback capacitor is coupled between the first voltage and the ground terminal, a voltage received by the negative input terminal of the operational amplifier is 0 and the positive input terminal of the operational amplifier is coupled to the common-mode voltage, and the output voltage outputted by the output terminal of the operational amplifier is equal to the common-mode voltage.

4. The capacitive touch sensing circuit of claim 2, wherein when the self-capacitance touch sensing circuit is operated in the first transfer phase, the third switch, the fifth switch, the eleventh switch and the twelfth switch are conducted and the first switch, the second switch, the fourth switch, the sixth switch to the tenth switch, the thirteenth switch and the fourteenth switch are not conducted.

5. The capacitive touch sensing circuit of claim 4, wherein since the third switch is conducted, the sensing capacitor is coupled between the negative input terminal of the operational amplifier and the ground terminal, and the output voltage is equal to {the common-mode voltage−[(the second voltage−the common-mode voltage)×the sensing capacitor/the amplifier capacitor]}.

6. The capacitive touch sensing circuit of claim 4, wherein when the self-capacitance touch sensing circuit counts in the first transfer phase, the third switch, the fourth switch, the eleventh switch and the twelfth switch are conducted and the first switch, the second switch, the fifth switch to the tenth switch, the thirteenth switch and the fourteenth switch are not conducted.

7. The capacitive touch sensing circuit of claim 6, wherein since the fourth switch is conducted, the feedback capacitor is coupled to the negative input terminal of the operational amplifier; if the self-capacitance touch sensing circuit counts K times before the first transfer phase ends, the output voltage is equal to {the common-mode voltage−[(the second voltage−the common-mode voltage)×the sensing capacitor/the amplifier capacitor]+[K×(the common-mode voltage−the first voltage)×the feedback capacitor/the amplifier capacitor], K is a positive integer.

8. The capacitive touch sensing circuit of claim 7, wherein when the self-capacitance touch sensing circuit is operated in the second charge phase, the first switch, the sixth switch, and the tenth switch are conducted, and the second switch to the fifth switch, the seventh switch to the ninth switch and the eleventh switch to the fourteenth switch are not conducted.

9. The capacitive touch sensing circuit of claim 8, wherein since the first switch is conducted, the sensing capacitor is coupled between the first voltage and the ground terminal, and since the sixth switch is conducted, the feedback capacitor is coupled between the second voltage and the ground terminal; after the self-capacitance touch sensing circuit counts K times, an amount of charges stored in the amplifier capacitor is {[K×(the first voltage−the common-mode voltage)×the feedback capacitor/the amplifier capacitor −(the common-mode voltage−the second voltage)×the sensing capacitor/the amplifier capacitor]×the amplifier capacitor}, and the output voltage outputted by the output terminal of the operational amplifier is equal to the common-mode voltage.

10. The capacitive touch sensing circuit of claim 8, wherein when the self-capacitance touch sensing circuit is operated in the second transfer phase, the third switch, the sixth switch, the thirteenth switch and the fourteenth switch are conducted, and the first switch to the second switch, the fourth switch to the fifth switch and the seventh switch to the twelfth switch are not conducted.

11. The capacitive touch sensing circuit of claim 10, wherein since the third switch is turned on, the detection capacitor is coupled between the negative input terminal and the ground terminal of the operational amplifier, and the output voltage is equal to the common mode voltage−[(the first voltage−the common mode voltage)×the detection capacitor/the amplifier capacitor]+[K×(the first voltage−the common mode voltage)×the feedback capacitor/the amplifier capacitor−(the common mode capacitor−the second voltage)×the detection capacitor Measure capacitance/Capacitance of this amplifier].

12. The capacitive touch sensing circuit of claim 10, wherein when the self-capacitance touch sensing circuit counts in the second transfer phase, the third switch, the fourth switch, the thirteenth switch and the fourteenth switch are conducted, and the first switch, the second switch, the fifth switch to the twelfth switch are not conducted.

13. The capacitive touch sensing circuit of claim 12, wherein since the fourth switch is conducted, the feedback capacitor is coupled to the negative input terminal of the operational amplifier, and the output voltage is equal to {the common-mode voltage−[(the first voltage−the common-mode voltage)×the sensing capacitor/the amplifier capacitor]+[K×(the first voltage−the common-mode voltage)×the feedback capacitor/the amplifier capacitor −(the common-mode voltage−the second voltage)×the sensing capacitor/the amplifier capacitor]+[(the common-mode voltage −the second voltage)×the feedback capacitance/the amplifier capacitance]}.

14. The capacitive touch sensing circuit of claim 12, wherein if the self-capacitance touch sensing circuit counts M times before the second transfer phase ends, the output voltage is equal to {the common-mode voltage −[(the first voltage−the common-mode voltage)×the sensing capacitor/the amplifier capacitance]+[K×(the first voltage −the common-mode voltage)×the feedback capacitance/the amplifier capacitance −(the common-mode voltage−the second voltage)×the sensing capacitance/the amplifier capacitance]+[M×(the common-mode voltage−the second voltage)×the feedback capacitance/the amplifier capacitance]}, and M is a positive integer.

15. The capacitive touch sensing circuit of claim 14, wherein in a case that (the first voltage+the second voltage)/2 is equal to the common-mode voltage, when [(the common-mode voltage−the second voltage)×the sensing capacitor]/[(the first voltage−the common-mode voltage)× the feedback capacitance] is not an integer, then M and K are not equal.

\* \* \* \* \*